(12) United States Patent
Thallner et al.

(10) Patent No.: US 10,852,528 B2
(45) Date of Patent: Dec. 1, 2020

(54) METHOD AND DEVICE FOR EXPOSURE OF PHOTOSENSITIVE LAYER

(71) Applicant: EV Group E. Thallner GmbH, St. Florian am Inn (AT)

(72) Inventors: Bernhard Thallner, St. Florian am Inn (AT); Boris Povazay, Vienna (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/464,838

(22) PCT Filed: Dec. 20, 2016

(86) PCT No.: PCT/EP2016/081888
§ 371 (c)(1),
(2) Date: May 29, 2019

(87) PCT Pub. No.: WO2018/113918
PCT Pub. Date: Jun. 28, 2018

(65) Prior Publication Data
US 2019/0293924 A1    Sep. 26, 2019

(51) Int. Cl.
| | | |
|---|---|---|
| G03F 7/20 | (2006.01) | |
| G03F 7/213 | (2006.01) | |
| G02B 26/08 | (2006.01) | |

(52) U.S. Cl.
CPC ....... *G02B 26/0833* (2013.01); *G03F 7/2051* (2013.01); *G03F 7/2053* (2013.01); *G03F 7/2057* (2013.01); *G03F 7/213* (2013.01); *G03F 7/7005* (2013.01); *G03F 7/70291* (2013.01);
(Continued)

(58) Field of Classification Search
CPC ............ G03F 7/70425; G03F 7/70433; G03F 7/70625; G03F 7/70633; G03F 7/70266; G03F 7/7025; G03F 7/70216; G03F 7/70291; G03F 7/70325; G03F 7/70375; G03F 7/70383; G03F 7/70391; G03F 7/2053; G03F 7/213; G02B 26/0833
See application file for complete search history.

(56) References Cited

U.S. PATENT DOCUMENTS 5,710,619 A * 1/1998 Jain .................... G03F 7/70241
355/50
5,745,459 A    4/1998 Inokuchi et al.
6,903,798 B2   6/2005 Shirota et al.
(Continued)

FOREIGN PATENT DOCUMENTS

CN    102338989 A    2/2012
CN    102338989 A    2/2012
(Continued)

OTHER PUBLICATIONS

International Search Report from corresponding International Patent Application No. PCT/EP2016/081888, dated Sep. 15, 2017.

*Primary Examiner* — Michelle M Iacoletti
(74) *Attorney, Agent, or Firm* — Kusner & Jaffe

(57) ABSTRACT

A method for exposing a light-sensitive layer to light using an optical system, wherein at least one light beam is generated by respectively at least one light source and pixels of an exposure pattern grid are illuminated by at least one micro-mirror device with a plurality of micro-mirrors. An affine distortion takes place, in particular a shearing, of the exposure pattern grid.

5 Claims, 3 Drawing Sheets

(52) U.S. Cl.
CPC ...... *G03F 7/70575* (2013.01); *G03F 7/70633* (2013.01)

(56) References Cited

U.S. PATENT DOCUMENTS

| | | | |
|---|---|---|---|
| 7,167,296 B2 | 1/2007 | Meisburger | |
| 8,218,130 B2 * | 7/2012 | Van Dam | G03F 7/70358 |
| | | | 355/53 |
| 9,366,968 B2 * | 6/2016 | Mann | G03F 7/702 |
| 2004/0057120 A1 | 3/2004 | Olszak et al. | |
| 2006/0146308 A1 | 7/2006 | Cebuhar et al. | |
| 2008/0313593 A1 | 12/2008 | Seo et al. | |
| 2009/0097002 A1 | 4/2009 | Fukuda et al. | |
| 2010/0084541 A1 * | 4/2010 | Peregrym | G03F 7/70291 |
| | | | 250/202 |
| 2013/0050775 A1 | 2/2013 | Curry et al. | |
| 2013/0088704 A1 | 4/2013 | Mei et al. | |
| 2016/0154318 A1 | 6/2016 | Endres | |
| 2016/0209759 A1 | 7/2016 | Deguenther et al. | |

FOREIGN PATENT DOCUMENTS

| | | |
|---|---|---|
| EP | 1262836 A1 | 12/2002 |
| EP | 2 658 257 A2 | 10/2013 |
| EP | 2658257 A2 | 10/2013 |
| JP | 2008-070785 A | 3/2008 |
| WO | WO 97/34171 | 9/1997 |
| WO | WO-1997/034171 A2 | 9/1997 |
| WO | WO 2015/074746 A1 | 5/2015 |
| WO | WO 2018/041326 A1 | 3/2018 |

\* cited by examiner

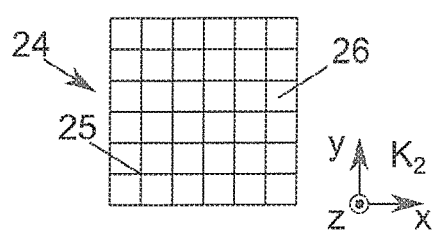
Fig. 5a
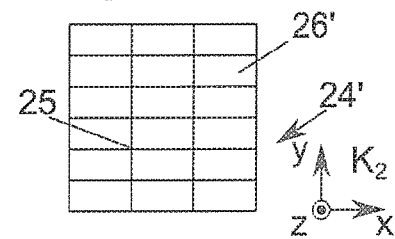
Fig. 5b
Fig. 6
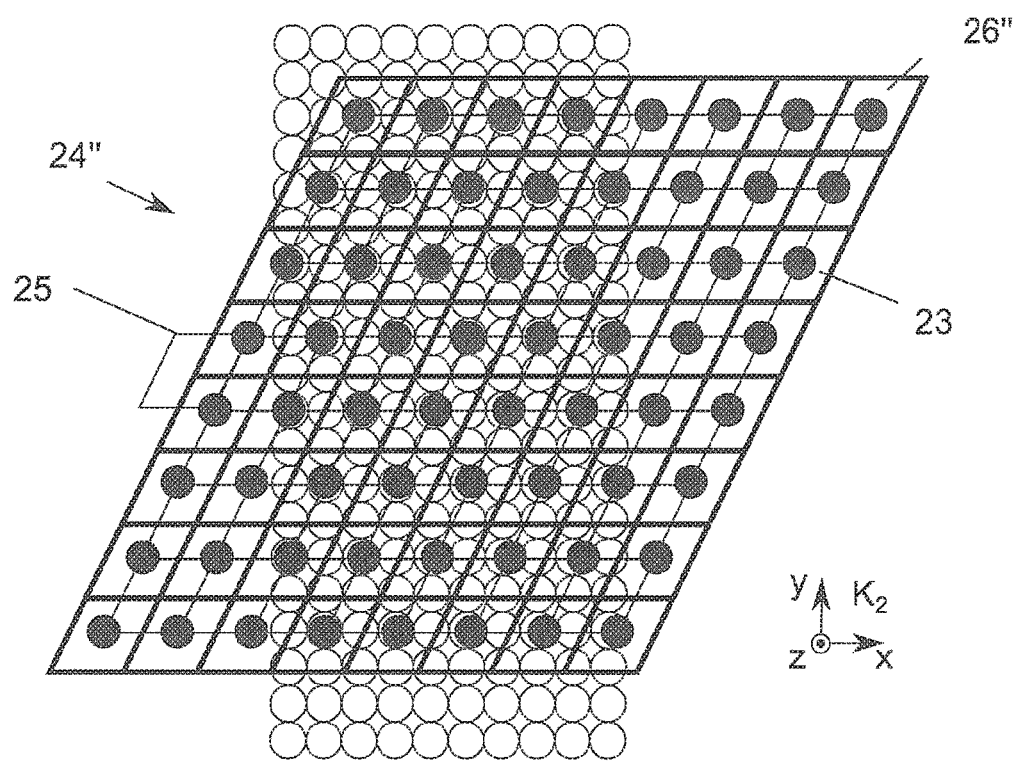

METHOD AND DEVICE FOR EXPOSURE OF PHOTOSENSITIVE LAYER

FIELD OF THE INVENTION

The present invention relates to a method for exposing a light-sensitive layer to light and to a corresponding device.

BACKGROUND OF THE INVENTION

Digital micro-mirror devices (DMDs) have been known in the art for a long time. These are optical elements comprised of a plurality of small mirrors which can be individually moved/aligned. Each mirror can be selectively electrically activated and oriented. This means that an optical system with a DMD can be used to selectively deflect a broad light beam in a spatially resolved manner. In most cases only two fully deflected positions per mirror are under consideration. Either a mirror allows the incident part of the light beam to pass through the optical system or it reflects the incident part of the light beam in such a way that the light is not passed further through the system. Each mirror of such a DMD can then be interpreted as a digital light switch.

In the art DMDs of this kind are used above all in projectors. They are also increasingly used in industrial environments, for example in 3D printing, 3D surveys and maskless lithography.

In the art all the known maskless exposure devices have a single light source, which irradiates the DMD and thus the surface to be exposed.

SUMMARY OF THE INVENTION

It is therefore the requirement of the present invention to eliminate the disadvantages of the state of the art and in particular to achieve an improved exposure result.

This requirement is met by the subjects of the subordinate patent claims as well as by the inventive idea disclosed below. Advantageous further developments are cited in the sub-claims. The scope of the invention also covers all combinations of at least two features indicated in the description, the claims and/or the drawings. In case of value ranges, all values within the said limits are deemed disclosed as limit values and can be claimed in random combination.

The invention shows, in particular, how an improved, faster higher-resolution exposure operation can be carried out.

The core idea of the invention includes performing a distortion of the DMD image with the aid of optical elements in such a way that an increased resolution can be achieved from the pattern of the intensity profiles.

The intensity profile is preferably chosen such that 50% of the energy of a pixel are to be found in the directly corresponding image surface and a further 50% are distributed across the adjacent fields. In a more preferred embodiment according to the invention the intensity profile of a pixel is chosen such that more than 50% of the energy of a pixel are to be found in the directly corresponding image surface and the remaining less than 50% are distributed across the adjacent fields. In another less preferred embodiment according to the invention the intensity profile of a pixel is chosen such that less than 50% of the energy of a pixel are to be found in the directly corresponding image surface and the remaining more than 50% are distributed across the adjacent fields.

In particular, the invention describes a maskless exposure device/a maskless exposure method. The exposure device is described by way of a number of embodiments which can be combined with each other. These optimising options are in particular independent of each other, but can be combined with each other.

The most important embodiment includes configuring the optical system in such a way that a distortion of the DMD image is obtained along the optical path.

Above all embodiments are disclosed, in which the optical system generates an orthogonally distorted view (in particular parallel to the surface of the layer to be exposed) of the original image between the DMD and the light-sensitive layer (the material) to be exposed). In particular, due to the optical distortion of the image the positional accuracy/the overlay can be improved. The positional accuracy relative to an existing structure is understood to mean specifically that the resolution of the structures to be written is improved due to the inventive distorted view of the original image.

The use of masks may be omitted so that the desired structure can be exposed directly into a light-sensitive (photosensitive) layer. Due to using a number of light sources a wider spectrum can be chosen and the light output and thus the achievable throughput can be increased.

According to the invention the device comprises in particular an optical system comprising the following features:
  at least one light source for generating at least one light beam,
  at least one micro-mirror device with a plurality of micro-mirrors, wherein each micro-mirror serves to illuminate one pixel of an exposure grid with a mirror intensity profile, wherein the optical system is configured such that a distortion of the DMD image takes place along the optical path. An example of the pixel is illustrated in FIG. 6, which is to be described further in the discussion below as is referenced as "23".

The inventive distortion is in particular an affine transformation, more preferably a shearing.

The invention describes a method and an equipment for irradiating a light-sensitive layer with the aid of a light beam, in particular a laser, which is directed through an optical system comprising at least one preferably digital micro-mirror device (DMD). Irradiating the layer causes a physical and/or chemical change in the layer.

The embodiments according to the invention can be configured in particular as
  full-surface
  continuously scanning
  stepped
maskless exposure devices. "Maskless" is understood to mean replacing the image of a static template (mask, reticle) by a system which creates a pattern in a dynamic and optical manner.

A full-surface maskless exposure device is understood to be an equipment, which comprises a DMD able to expose the entire area to be written to without causing a noticeable relative displacement between the layer to be exposed and the optical system. According to the present state of the art this can only be used to expose very small substrates because the size of today's DMDs is limited.

A scanning maskless exposure device is understood to mean a device/a method, where the exposure field is smaller than the area to be exposed, so that a relative displacement between the optical system and the layer to be exposed is effected in order to expose the entire exposure field. This relative displacement is effected in particular continuously along a path. The path is preferably:
  meander-shaped linear with displacement into the next line and return to the start on reaching the end spiral-shaped circular linear.

In particular the said paths can be combined with each other. As such it is feasible to initially use a spiral-shaped path for exposure, followed by a linear path which in particular passes through the centre of the substrate and joins a number of initially independent writing paths to each other. Preferably a meander-type path is followed.

A stepped maskless exposure device is understood to be a system, where the exposure field is smaller than the area to be exposed, a relative displacement between the optical system and the layer to be exposed is performed in steps and no exposure takes place between individual steps. It is not until the optical system and the layer to be exposed are in a well-defined position that the optical system exposes the layer to be exposed. With this embodiment therefore exposure comprises exposing a number of partial areas of the layer to be exposed.

The DMD Principle

A DMD permits the selective deflection of, in particular, several parts of a preferably parallel and/or non-scattering broad primary light beam. This allows a spatially structured, secondary light beam for exposure to be generated without the aid of a mask. Usually lenses, in particular projection lenses, are arranged upstream and/or downstream of the DMD, which are able to manipulate (in particular scale) the secondary exposure beams reflected by the DMD, and in micro lithography can generate in particular a reduction of the DMD image. The DMD image can thus be suitably reduced.

The resulting structural resolution of a DMD is in particular between 0.1 µm and 50 µm, preferably between 0.3 µm and 25 µm, more preferably between 1 µm and 10 µm.

In particular for embodiments, for which the individual exposure field is smaller than the substrate, it is important that following a relative movement between the optical system and the layer to be exposed, a seamless continuance of the structures to be generated is achieved. In case of a stepped procedure this takes place in two independent directions, in case of continuous scanning usually only in one direction.

The Optical System

The embodiments according to the invention comprise at least one optical system, which may include a number of optical elements of a different kind. At least one of the optical elements is a DMD, although the use of several DMDs constitutes a further embodiment according to the invention. In particular exactly one DMD, preferably at least two DMDs, more preferably at least four DMDs, are present in the optical system. The optical system itself may be employed in one or more forms in parallel on a substrate within an equipment. Also parallel exposure of a number of substrates within the equipment is feasible according to the invention.

Furthermore the following optical elements may be present in the optical system:

Illumination optics
    Coherent light sources, in particular
        Laser light sources
            Laser diodes
            Solid body lasers
            Excimer lasers -continued Incoherent light sources
        Gas discharge lamps, in particular
            Mercury vapour lamps
        LED
    Partially coherent light sources
    Coherence-changing components
Deflection optics
    DMDs
    Mirrors, in particular
        Cold mirrors
        Warm mirrors
    Refraction elements, in particular
        Prisms
        Beam splitters
Projection optics
    Lenses in particular
        Fresnel lenses
        Refraction lenses
            Convex lenses
            Concave lenses
            Biconcave lenses
            Biconvex lenses
            Convex-concave lenses
            Concave-convex lenses
        Cylinder lenses
        Compound lenses
    Mirrors, in particular
        Cylinder mirrors
    General beam-changing optical components The light sources can be used continually or in pulsed mode, in particular modulated internally or externally.

The maximum possible relative speed between the optical system and the layer to be exposed is restricted in particular by the maximum control frequency of the DMD (i.e. the frequency at which individual mirror elements of a DMD can actually be switched). The relative speed in a scanning system is further determined by the displacement and/or deflection optics and in particular, lies between 5 mm/s and 500 mm/s, preferably between 10 mm/s and 250 mm/s, more preferably between 15 mm/s and 200 mm/s, most preferably between 25 mm/s and 100 mm/s.

A further important aspect of one embodiment of the invention is that the feed rate used must be higher than the feed rate defined by the grid size and the scanning frequency. By choosing a respectively higher feed rate, lines are omitted which, over time, are supplemented by later exposure lines of the DMD.

Integrated Measuring Optics

Preferably the device comprises a measuring optics integrated in the optical system, in particular. Most preferably a beam splitter is used for coupling the light reflected by the layer to be exposed, out of the same optical path, with which the DMD is impacted for the exposure. The measuring optics is used for several important tasks which however do not need to be performed all at the same time. These are:

Alignment in order to align the exposure field with existing structures on the substrate or re-shape it, Calibration and checking the writing head, In-situ control of the writing operation, Real time correction in case of dynamic changes in the relative image substrate layer Alignment takes places either relative to alignment marks already applied to the substrate or relative to structures deliberately applied or pre-existing, which serve as alignment marks or pass marks for the structures to be newly exposed. According to the invention this makes it possible to expose large surfaces in that the optical system is newly aligned with the newly exposed structures and/or calibrated.

A further important aspect of one embodiment according to the invention is that a possible distortion of the substrate caused by previous processes and/or thermal influences is calculated by comparing the currently measured position of the alignment marks with the set positions, and the image to be written is adapted to this distortion. The distortions may be distortions of a higher order.

Specifically when avoiding "sewing artefacts" (errors at the transition between adjacent pixels and/or adjacent exposure grids) alignment and/or real-time correction plays an important role.

By capturing the structures (including surface-typical noises) of the exposure field during exposure and a comparison with adjacent exposure structures being captured, an offset of the substrate can be determined by means of correlation or similar procedures. The offset is used as an error signal to impact the DMD image, thus facilitating compensation reaching as far as the sub-pixel range.

Capturing/measuring takes preferably place along the same optical path as used for exposing so that it is possible to realise a mechanical connection, in particular a fix, during capturing/measuring.

Capturing/measuring is effected by coupling the light signal (light beam of the at least one light source) out of the surface via an optical element, preferably a semi-transparent mirror or a prism, and detecting it by means of a corresponding detector. The detector (or an evaluation system connected to it) is then able to monitor the surface of the layer to be structured, whilst it is exposed/written to. The detector is preferably a camera, more preferably a CCD or CMOS camera. The camera image may detect one or more parts, a larger area or one or more smaller partial areas of the irradiation field.

The exposure process may have its own light source and be effected in (preferably) the same or in another wavelength range of the irradiation.

A particular further extended embodiment includes a measuring optics on the underside of the inventive embodiment, with the aid of which alignment marks can be detected on the underside of the substrate holder or the substrate. Underside measurement of the substrate holder, in principle, is similar that in the embodiment disclosed in the PCT/EP2016/070289. Measuring alignment marks on the underside makes it possible to create structures on both sides which are facing each other.

The output of the light source lies in particular between 0.01 watt and 1000 watt, preferably between 0.1 watt and 500 watt, more preferably between 1 watt and 100 watt, even more preferably between 5 watt and 100 watt, most preferably between 9 and 13 watt.

Intensity is indicated in w/m$^2$. By bunching the rays by means of optical lenses to a unit area, intensity is easy to calculate. The intensity of the light source can preferably be very precisely controlled. Intensity is altered either by altering the output of the light source, the duration of the exposure or by optical elements in the optical system. Thus the invention makes it possible to irradiate the DMD with light beams of different intensity within a well-defined period of time. Thus by using appropriate mirror control, individual points of the layer to be exposed can be irradiated at defined intensities. The points surrounding the layer to be exposed may be irradiated at an intensity different therefrom.

Anisotropic and/or Distorted Imaging Optics for Improving the Overlay Error and/or Motion Blur In one inventive embodiment horizontal and/or vertical exposure pattern grid lines of the exposure grid are mapped differently (i.e. in particular not square) due to the optical mapping, so that the resulting resolution of the exposure grid is different in vertical and in horizontal direction. Calculation/control of the exposure is compensated for by the deviation.

In a further embodiment the axes of the image/the exposure pattern grid lines are arranged so as to extend, not orthogonally, but obliquely. Use of such an in particular affinely distorted projection (in particular a shearing) allows a simple calculation of the irradiated positions and linear guidance with precise placing of the illumination points below the grid resolution (sub-pixel accuracy) for a highly precise shaping of the exposure edges.

In further inventive embodiments the horizontal and/or vertical exposure pattern grid lines of the exposure grid along the vertical and/or horizontal direction are not executed equidistantly.

The different exposure grids can be generated from a homogenous isotropic image of the DMD by the optical elements upstream and/or downstream of the DMD and/or are the direct result of an anisotropic and/or inhomogeneously constructed DMD.

Some options are indicated further below on how a correspondingly inventive projection, in particular a shearing of the exposure grid, can be generated.

In a first inventive possible embodiment at least one cylinder lens with a cylinder axis as imaging optics is used. In particular exactly two cylinder lenses are used. The cylinder axes of the cylinder lenses preferably extend in parallel with the surface to be exposed. In order to achieve a shearing according to the invention an angle between the two cylinder axes smaller than 70°, more preferably smaller than 50°, most preferably smaller than 20° is set. The angle most preferred results, however, from the shear angle to be generated.

With a further inventive embodiment the optical system comprises a single so-called compound lens. A compound lens is understood to be a lens the surfaces of which were ground such that the optical properties are identical to those optical properties which would be obtained by combining two lenses.

The embodiments described above can be achieved with both regular and irregular irradiation of the substrate. In a special case of an exposure repetition rate which is regular but not an integer exactly matching the moving speed, the exposure structures continue to be activated exactly in line with the current writing position. Correspondingly non-integer offsets relative to sub-pixel placings take place in moving direction, which result in an improved placing accuracy and also edge roughness.

A combination of the above-described geometric and/or time-related displacements produces a sub-pixel resolution in all directions and reduces susceptibility to errors in relation to failures of individual exposure components. In order to characterise the correctly metered exposure distribution, it is necessary to have knowledge of distortions caused by mapping errors and/or of artificially caused distortions. Linearly distorted or twisted images have the advantage of being easier to calculate with easier control of the light source.

All said inventive embodiments and processes can be randomly combined with each other, but are individually described. Insofar as process features are described these shall be deemed disclosed also as device features and vice-versa.

Further advantages, features and details of the invention are disclosed in the description below of preferred embodiments.

BRIEF DESCRIPTION OF THE DRAWINGS

FIG. 5a shows a schematic not-to-scale enlarged view of a first embodiment of an exposure pattern according to the invention, FIG. 5b shows a schematic not-to-scale enlarged view of a first embodiment of an exposure pattern according to the invention, FIG. 6 shows a schematic view of an exposure pattern distorted by optical elements In the figures identical components or components having the same function are marked with identical reference symbols.

DETAILED DESCRIPTION OF THE INVENTION

Figure 1:
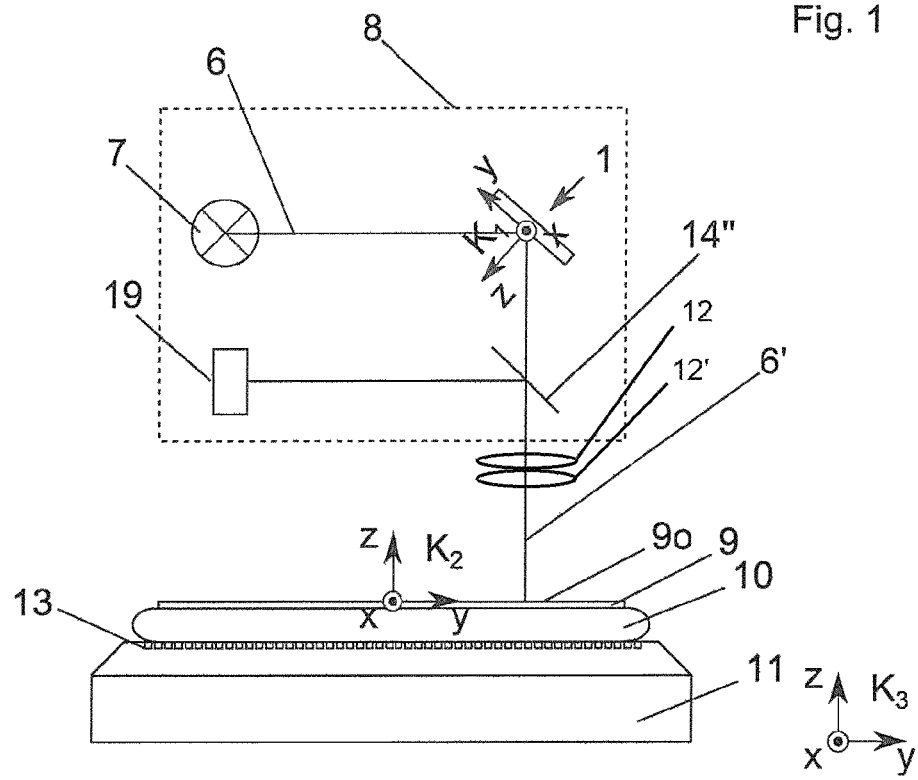
FIG. 1 shows a first embodiment of the device according to the invention.

FIG. 1 shows a first embodiment comprised of an optical system 8 with at least one light source 7 and at least one DMD 1 (micro-mirror device) and a substrate holder 11. The substrate holder 11 can be moved in relation to a coordinate system K3.

Using fixing means 13 a substrate 10 is fixed to the substrate holder 11, the substrate 10 having a light-sensitive layer 9 from an exposable material on it, which is exposed to light by means of the device.

The origin of a fixed-sample coordinate system K2 (i.e. fixed to the substrate 10/the light-sensitive layer 9) is preferably placed in the centre of the surface 9o of layer 9.

A light beam 6 (primary beam), which is emitted by the light source 7 and, on the way to the DMD 1, may pass a number of optical elements (not shown), is changed by the DMD 1 into a structured light beam 6' (secondary beam). The beam may pass a number of optical elements, such as two cylinder lenses 12, 12', on the way to the layer 9.

Using a semi-transparent mirror 14" a detector 19, in particular a camera, more preferably a CCD or CMOS camera, may directly detect and/or measure the surface 9o of the layer 9 to be exposed. The measuring results are preferably used to directly control the process and/or calibrate the device. In the description below and in the further figures a depiction of these measuring means has for clarity's sake been omitted. The measuring means according to the invention may however be used in any of the said inventive embodiments.

Figure 2:
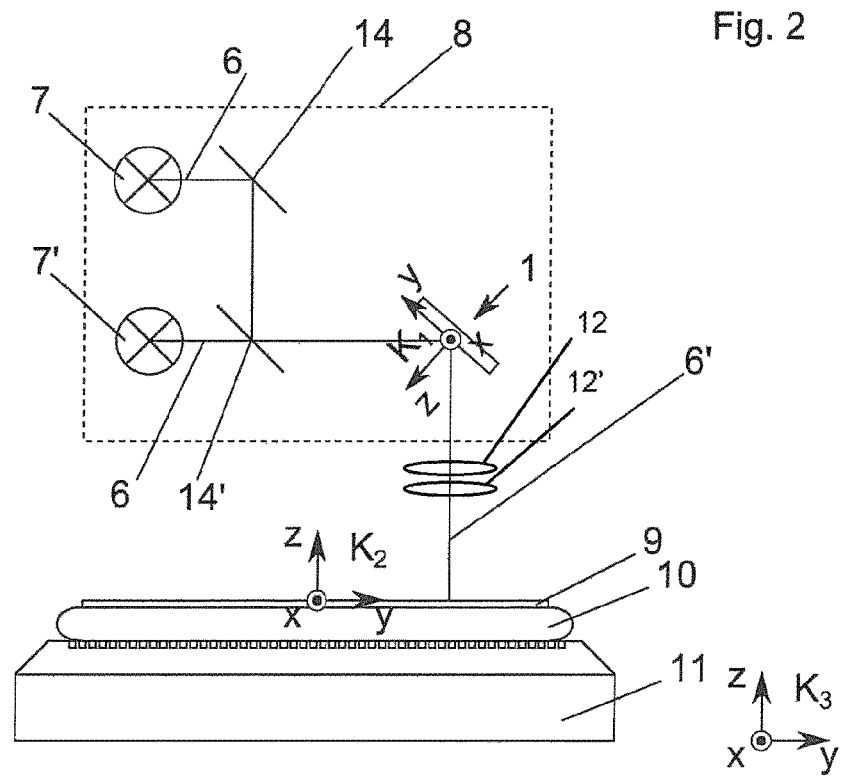
FIG. 2 shows a second embodiment of the device according to the invention.

FIG. 2 shows a second embodiment, wherein here the optical system 8 is provided with two light sources 7, 7'. Light beams 6 are emitted by both light sources 7, 7'. One of the light beams 6 is deflected by a mirror 14 to go to the beam splitter 14' and by means thereof is united with the light beam 6 of the second light source 7'.

The united light beam 6 is guided to the DMD 1 and converted by the same into a structured light beam 6', which again, on the way to layer 9, may pass a number of optical elements such as two cylinder lenses 12, 12'.

One, in particular autonomous, inventive aspect is that, above all, the two light sources 7 may be different with regard to radiation intensity, wavelength, coherence length and possibly further properties or parameters, so that a laser beam 6 with a plurality of different optical parameters can be generated.

According to the invention in particular more than two light sources, in particular more than 5, more preferably more than 10, most preferably more than 20 light sources 7, 7' may be used. Each light source may preferably be a LED field or a laser diode (LD) field.

Figure 3:
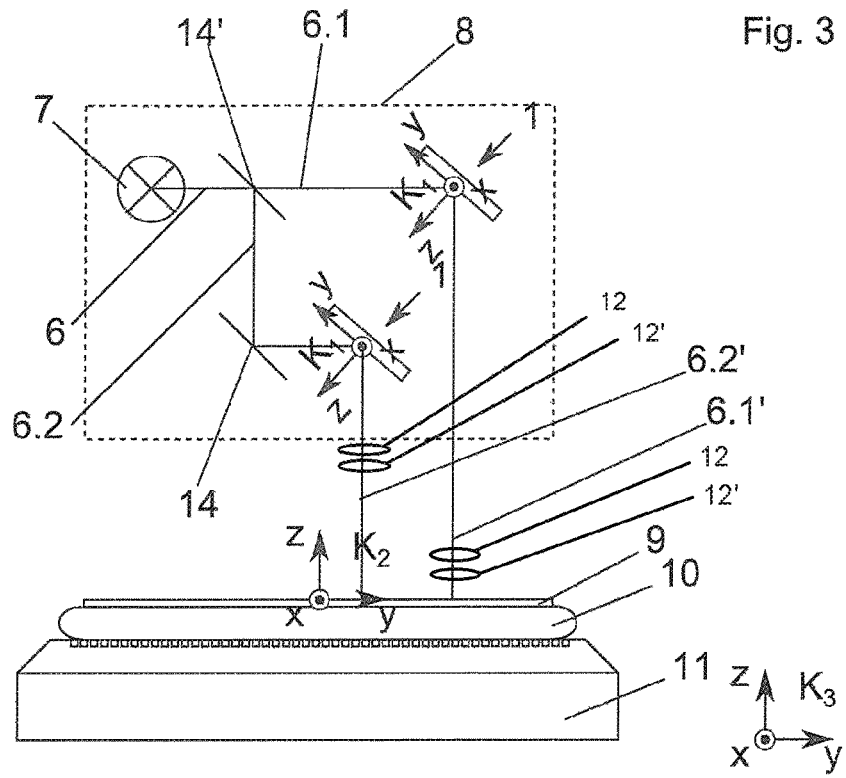
FIG. 3 shows a third embodiment of the device according to the invention.

FIG. 3 shows a third embodiment comprised of an optical system 8 with at least one light source 7 and two DMDs 1.

A light beam 6 is emitted by the light source 7 and split by a beam splitter 14'. A first split beam 6.1 is modified by a first DMD 1 to result in a first modified beam 6.1'. The layer 9 is exposed to this first modified beam 6.1'. The second split beam 6.2 is deflected by means of a mirror 14 in direction of a second DMD 1 and is then directed as a second modified beam 6.2' to the layer 9. Preferably the second modified beam 6.2' is directed at a position in the layer 9, which is different from the position at which the first modified beam 6.1' is directed. All said beams may pass through a number of optical elements, such as two cylinder lenses 12, 12'.

One, in particular autonomous, inventive aspect is that at least two DMDs 1 are used by means of which two positions of layer 9 can be exposed simultaneously, wherein preferably a single, in particular united, beam is used for acting on the DMDs. This leads, in particular, to a widening of the exposed section, in particular the exposed strip, and thus to an increase in throughput.

Figure 4A:
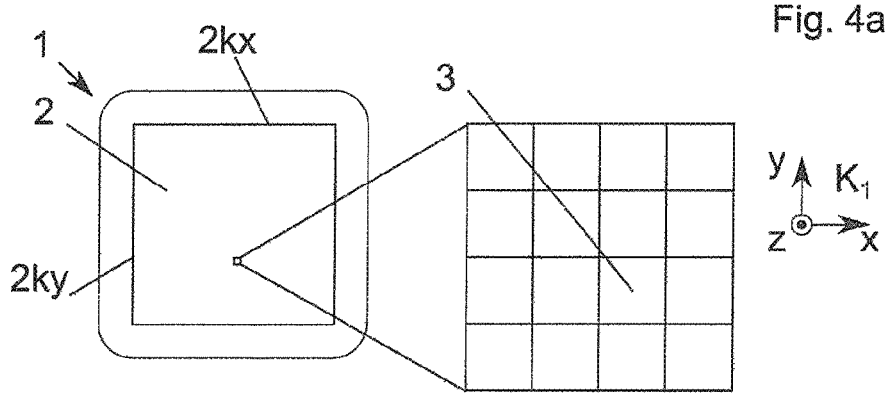
FIG. 4a shows a schematic not-to-scale view of a DMD (micro-mirror device) with an enlarged partial section with micro-mirrors in a first position.

FIG. 4a shows the DMD 1 with a mirror surface 2. The enlarged view of a part of the mirror surface 2 shows several (16) mirrors 3 of a plurality of mirrors 3. The mirrors are arranged in a non-tilted alignment called the starting position. The DMD 1 is assigned to a coordinate system K1. The Z-axis of K1 (i.e. K1z) extends normal to the mirror surface 2, the x-coordinate and the y-coordinate extend in parallel to the mirror surface edges 2kx and 2ky of the mirror surface 2 and define a mirror plane.

Figure 4B:
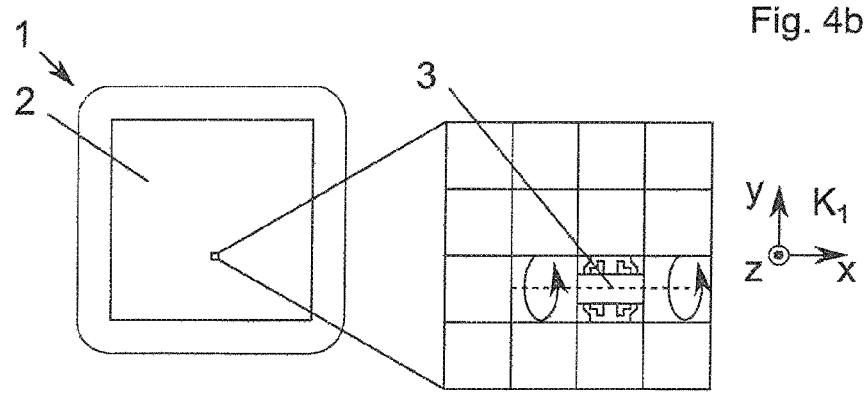
FIG. 4b shows a schematic not-to-scale view of a DMD (micro-mirror device) with an enlarged partial section with micro-mirrors in a second position.

FIG. 4b shows the same DMD 1, wherein one of the mirrors 3 is arranged in a position tilted or rotated about the x-axis. The part of the beam 6 hitting the tilted mirror 3 is therefore reflected in a direction which is not identical to the reflection direction of the parts of the beam 6 reflected by the non-tilted mirrors 3.

FIG. 5a shows a first less preferred inventive exposure pattern 24, which in both mutually orthogonal directions K2x, K2y, is at equidistant distances from the exposure pattern grid lines. The exposure pattern 24 is thus isotropic and homogeneous in both directions K2x and K2y.

FIG. 5b shows a second more preferred exposure pattern 24' according to the invention, which has, for each direction, its own equidistant direction-related distance between the exposure pattern grid lines. The exposure pattern 24' is thus isotropic, but homogeneous in each of directions K2x and K2y.

It is also feasible for exposure to take place at exposure pattern grid line intersections 25 and/or exposure pattern partial surfaces 26, 26', 26" and not within individual grid surfaces.

The different exposure patterns 24, 24', 24" can in particular be created/modified by means of optical elements mounted upstream and/or downstream of the DMD 1 such as the two cylinder lenses 12, 12' illustrated downstream of the DMD 1 in FIGS. 1-3. The DMD 1 illustrated in FIGS. 1-4b would preferably be isotropic and homogeneous, wherein the, particularly the downstream, optical elements, such as the two cylinder lenses 12, 12' illustrated downstream of the DMD 1 in FIGS. 1-3, are constructed to effect an anisotropic and/or homogeneous imaging of the DMD.

FIG. 6 shows a schematic not-to-scale top view of an exposure pattern 24" distorted in particular, by optical elements of the optical system 8, such as the two cylinder lenses 12, 12' illustrated downstream of the DMD 1 in FIGS. 1-3.

The optical elements, such as the two cylinder lenses 12, 12' illustrated downstream of the DMD 1 in FIGS. 1-3, cause the partial beams reflected by the mirrors 2 of the DMD 1 to be orthogonally reflected in direction of the layer 9 to be exposed, however a distortion takes place, preferably exclusively, within the K2x-K2y plane. Due to this method according to the invention an exposure pattern 24" can be optically created which leads to an inventive increase in the overlay. The DMD 1 in this embodiment is preferably not positioned obliquely, rather the original image of the DMD 1 undergoes an affine distortion in order to achieve the oblique position of the exposure pattern 24".

LIST OF REFERENCE SYMBOLS

1 DMD
2 mirror surface
2kx, 2ky mirror surfaces edges
3 mirror
6 light beam (beam)
6' modified/structured beam
6.1 first split beam
6.1' first modified beam
6.2 second split beam
6.2' second modified beam
7,7' light source
8 optical system
9 layer
9o surface of the layer
10 substrate
11 substrate holder
12, 12' cylinder lenses
13 fixing means
14 mirror
14' beam splitter
14" semi-transparent mirror
19 detector
23 pixel
24, 24', 24" exposure pattern grid
25 exposure pattern grid line intersection
26, 26', 26" exposure pattern partial surface
K1, K2, K3 coordinate systems
K2x, K2y mutually orthogonal directions Having described the invention, the following is claimed:

1. A method for exposing a light-sensitive layer to light using an optical system, said method comprising:
   directing at least one light beam generated by at least one light source, respectively, to at least one micro-mirror device having one or more micro-mirrors to respectively illuminate one or more pixels to generate an image of the micro-mirror device; and
   effecting, via two cylinder lenses, a shearing of the generated image to form horizontal and/or vertical exposure pattern grid lines of a pattern grid to which the light-sensitive layer is exposed, each of the cylinder lenses having a cylinder axis,
   wherein greater than 50% of an energy of each of the pixels is found in a field of the light-sensitive layer having an image that directly corresponds with the pixel, and
   wherein a remaining amount of the energy of each of the pixels is distributed across adjacent fields to the field having the image that directly corresponds with the pixel.

2. The method according to claim 1, wherein the method includes arranging the horizontal and/or vertical exposure pattern grid lines obliquely.

3. The method of claim 1, wherein the two cylinder lenses are combined to form a compound lens.

4. A device for exposing a light-sensitive layer to light, the device comprising:
   at least one light source for respectively generating at least one light beam,
   at least one micro-mirror device toward which the light beam is directed by the light source, the micro-mirror device having one or more micro-mirrors configured to respectively illuminate one or more pixels to generate an image of the micro-mirror device,
   two cylinder lenses, each cylinder lens having a cylinder axis, the cylinder lenses being configured to effect a shearing of the generated image to form horizontal and/or vertical exposure pattern grid lines of a pattern grid to which the light-sensitive layer is exposed,
   wherein greater than 50% of an energy of each of the pixels is found in a field of the light-sensitive layer having an image that directly corresponds with the pixel, and
   wherein a remaining amount of the energy of each of the pixels is distributed across adjacent fields to the field having the image that directly corresponds with the pixel.

5. The device of claim 4, wherein the two cylinder lenses are combined to form a compound lens.

* * * * *